United States Patent
Wang et al.

(10) Patent No.: US 12,256,569 B2
(45) Date of Patent: Mar. 18, 2025

(54) SILICON CARBIDE MOSFET DEVICE AND CELL STRUCTURE THEREOF

(71) Applicant: ZHUZHOU CRRC TIMES SEMICONDUCTOR CO., LTD., Hunan (CN)

(72) Inventors: Yafei Wang, Hunan (CN); Xiaoping Dai, Hunan (CN); Chengzhan Li, Hunan (CN); Yangang Wang, Hunan (CN)

(73) Assignee: ZHUZHOU CRRC TIMES SEMICONDUCTOR CO., LTD., Zhuzhou (CN)

( * ) Notice: Subject to any disclaimer, the term of this patent is extended or adjusted under 35 U.S.C. 154(b) by 446 days.

(21) Appl. No.: 17/774,853

(22) PCT Filed: Dec. 25, 2019

(86) PCT No.: PCT/CN2019/128390
§ 371 (c)(1),
(2) Date: May 5, 2022

(87) PCT Pub. No.: WO2021/088232
PCT Pub. Date: May 14, 2021

(65) Prior Publication Data
US 2022/0406929 A1    Dec. 22, 2022

(30) Foreign Application Priority Data
Nov. 8, 2019  (CN) .......................... 201911089113.2

(51) Int. Cl.
H10D 84/00    (2025.01)
H10D 30/66    (2025.01)
H10D 62/10    (2025.01)
H10D 62/17    (2025.01)
(Continued)

(52) U.S. Cl.
CPC ......... *H10D 84/146* (2025.01); *H10D 30/668* (2025.01); *H10D 62/109* (2025.01);
(Continued)

(58) Field of Classification Search
CPC ............... H01L 29/7806; H01L 29/063; H01L 29/0696; H01L 29/1095; H01L 29/1608;
(Continued)

(56) References Cited

U.S. PATENT DOCUMENTS

2018/0308972 A1\* 10/2018 Ohse .................... H01L 21/0495
2019/0027568 A1\*  1/2019 Gao ....................... H01L 21/049
(Continued)

FOREIGN PATENT DOCUMENTS

| CN | 106784008 A |   | 5/2017 |            |
|----|-------------|---|--------|------------|
| CN | 106876485 A | \* | 6/2017 | ............. H01L 21/77 |
| JP | H09102602 A | \* | 4/1997 |            |

OTHER PUBLICATIONS

International search report of PCT Patent Application No. PCT/CN2019/128390 issued on Aug. 12, 2020.

*Primary Examiner* — Joseph C. Nicely
*Assistant Examiner* — Alvin L Lee (57) ABSTRACT

A cell structure of a silicon carbide MOSFET device, comprising a first conductivity type drift region (3) located above a first conductivity type substrate (2). A main trench is provided in the surface of the first conductivity type drift region (3); a Schottky metal (4) is provided on the bottom and sidewalls of the main trench; a second conductivity type well region (7) is provided in the surface of the first conductivity type drift region (3) and around the main trench; a source region (8) is provided in the surface of the well region (7); a source metal (10) is provided above the source region (8); a gate insulating layer (6) and a gate (5) split into two parts are provided above the sides of the source (Continued)

region (8), the well region (7), and the first conductivity type drift region (3) close to the main trench.

9 Claims, 10 Drawing Sheets

(51) Int. Cl.
    *H10D 62/832*     (2025.01)
    *H10D 64/27*     (2025.01)
    *H10D 64/64*     (2025.01)
    *H10D 84/80*     (2025.01)

(52) U.S. Cl.
    CPC .......... *H10D 62/127* (2025.01); *H10D 62/393* (2025.01); *H10D 62/8325* (2025.01); *H10D 64/512* (2025.01); *H10D 84/811* (2025.01); *H10D 62/106* (2025.01); *H10D 64/64* (2025.01); *H10D 84/00* (2025.01)

(58) Field of Classification Search
    CPC . H01L 29/7813; H01L 29/0619; H01L 29/47; H01L 23/552; H01L 27/07; H01L 27/0727; H01L 29/42356
    See application file for complete search history.

(56) References Cited

U.S. PATENT DOCUMENTS

2019/0267486 A1*   8/2019   Ueno .................. H01L 29/1608
2021/0273083 A1*   9/2021   Yamashiro .......... H01L 29/7397

\* cited by examiner (Prior Art)

SILICON CARBIDE MOSFET DEVICE AND CELL STRUCTURE THEREOF

The disclosure claims the priority of Chinese patent application CN 201911089113.2, entitled "Silicon Carbide MOSFET Device and Cell Structure Thereof" and filed on Nov. 8, 2019, the entirety of which is incorporated herein by reference.

FIELD OF THE INVENTION

The disclosure relates to the technical field of power semiconductor devices, and in particular, to a split-gate silicon carbide MOSFET device integrated with an SBD, and a cell structure of the silicon carbide MOSFET device.

BACKGROUND OF THE INVENTION

Silicon carbide (SiC) is a new type of wide bandgap semiconductor material, and has excellent physical, chemical, and electrical properties, for example, silicon carbide has a breakdown electric field strength which is 10 times that of traditional silicon and a thermal conductivity which is 3 times that of silicon, which enable silicon carbide to be very attractive and have a good application prospect in power semiconductor devices, in particular in a high-power and high-temperature application environment.

Silicon carbide bipolar devices are limited by a manufacturing defect of a substrate formed of a silicon carbide material, and there is a "bipolar degradation" phenomenon. As a result, during long-term use of the silicon carbide bipolar devices, voltage drop and reverse bias leakage current increase, which goes against the long-term use reliability of the silicon carbide bipolar devices.

Figure 1:
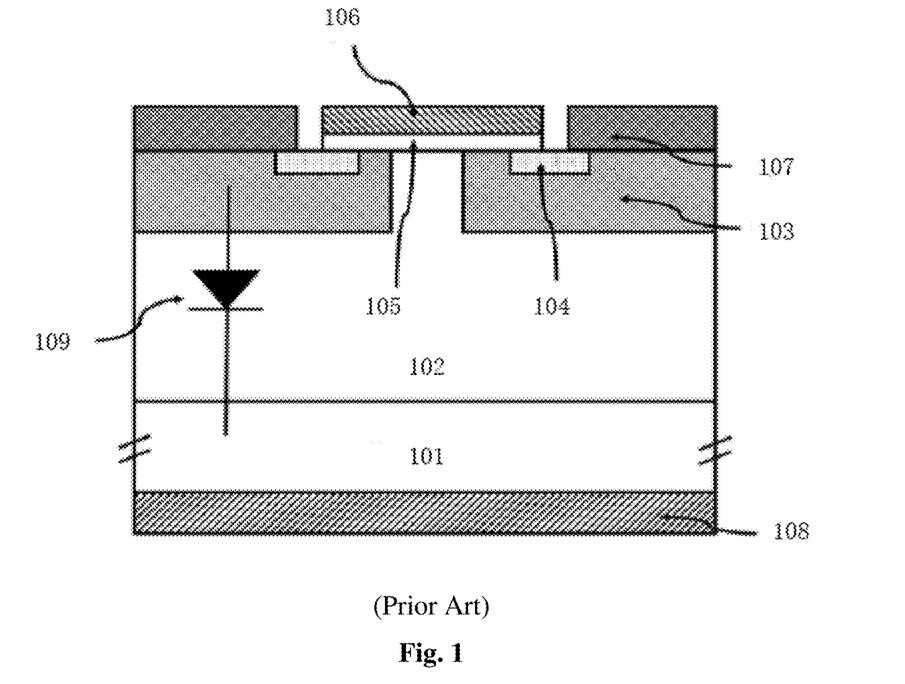
FIG. 1 shows an existing traditional planar gate N-type channel MOSFET device and a parasitic PIN body diode.

Besides, a traditional MOSFET device with a planar gate N-type channel structure further has a parasitic PIN body diode in its cell structure in addition to a MOS structure, as shown in FIG. 1. The MOSFET device includes: a first conductivity type enhancement substrate layer 101, a first conductivity type drift region 102, a second conductivity type well region 103, a first conductivity type enhancement source region 104, a gate oxide layer 105, gate polycrystalline silicon 106, a source metal 107, a drain metal 108, and a body PIN diode 109. In order to suppress turn-on of the PIN diode in the silicon carbide MOSFET device, which causes the bipolar degradation, a relatively effective method is to use an SBD in an anti-parallel manner with the MOSFET device as its free-wheel diode. However, using the MOSFET device and the SBD in the anti-parallel manner at the chip level will increase the manufacturing cost of module packaging, and increase the stray inductance due to the introduction of additional bonding wires, resulting in a decrease in the electrical performance of a module.

Therefore, it is necessary to provide a new MOSFET device to improve the above problems.

SUMMARY OF THE INVENTION

In order to solve the above problems in some circumstances, the disclosure provides a split-gate silicon carbide metal-oxide-semiconductor field-effect transistor (MOSFET) device integrated with an SBD, and provides a cell structure of the silicon carbide MOSFET device.

The disclosure provides a cell structure of a silicon carbide MOSFET device, including: a first conductivity type drift region, which is located above a first conductivity type substrate; a main trench, which is provided downwardly in a surface of the drift region; a Schottky metal being provided on surfaces of a bottom and sidewalls of the main trench; a second conductivity type well region, which is located in the surface of the drift region and provided around the main trench; a first conductivity type source region, which is located in a surface of the well region, the source region being located at a side, close to the main trench, of the well region but being not in contact with the main trench; a gate structure, which is located at sides, close to the main trench, of the source region, the well region, and the drift region, the gate structure including a gate and a gate insulating layer for isolating the gate from the source region, the well region, and the drift region; a source metal, which is located above the source region; and a drain metal, which is located below the substrate, the source metal being connected to the Schottky metal via a source compacted block metal above the source metal, at least the gate in the gate structure being isolated from the source metal, the Schottky metal, and the source compacted block metal.

The disclosure further discloses a silicon carbide MOSFET device, including a cell structure of the silicon carbide MOSFET device described above.

Other features and advantages of the disclosure will be set forth in the following description, and will partly become apparent from the description or be understood through implementation of the disclosure. The objective and other advantages of the disclosure can be achieved or obtained through structures specifically pointed out in the description, claims, and the accompanying drawings.

BRIEF DESCRIPTION OF THE DRAWINGS

The accompanying drawings are used to provide further understanding of the disclosure, constitute part of the description, are used to explain the disclosure in conjunction with embodiments of the disclosure, and do not constitute limitations on the disclosure. In the accompanying drawings:

FIG. 4-1 is a schematic diagram of the cell structure of the silicon carbide MOSFET device, in which a sidewall area of a main trench is provided with a P-type shielding layer, according to Embodiment Two of the disclosure;

FIG. 4-2 is a schematic diagram of the cell structure of the silicon carbide MOSFET device, in which a bottom area of the main trench is provided with a P-type shielding layer, according to Embodiment Two of the disclosure;

FIG. 5-1 is a schematic diagram of the cell structure of the trench-type silicon carbide MOSFET device, in which a trench gate is provided in a well region, according to Embodiment Three of the disclosure;

DETAILED DESCRIPTION OF THE EMBODIMENTS

In order to make the objective, solutions and advantages of the disclosure clearer, the disclosure is further described in detail with reference to the accompanying drawings, through which the implementation process of how the disclosure use the means to solve the problem and achieve the effect can be fully understood, and the disclosure can be carried out accordingly. It should be noted that, as long as there is no conflict, within the spirit and principle of the disclosure, respective embodiments in the disclosure and various features in respective embodiments may be combined with each other, and solutions formed from any amendment, equivalent replacement, improvement made by those skilled in the art shall all fall into the protection scope of the disclosure.

Embodiment One

Figure 2:
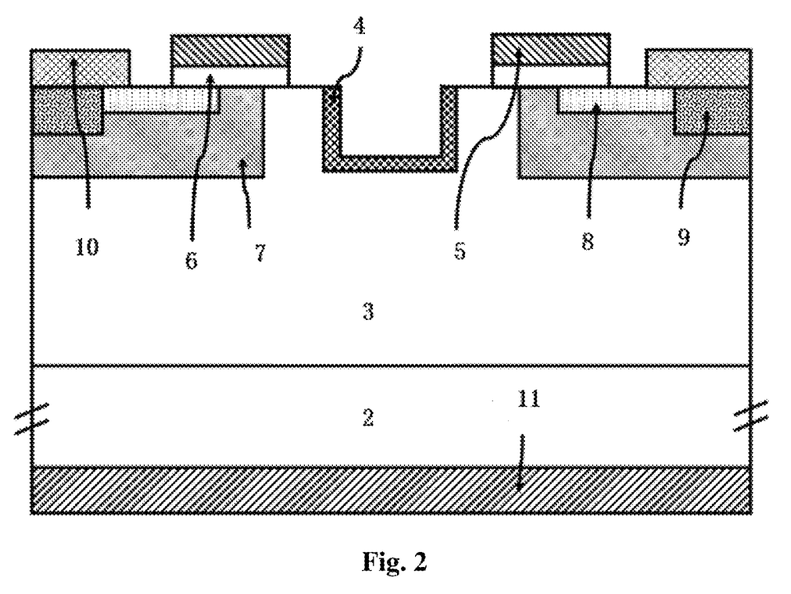
FIG. 2 is a schematic diagram of a cell structure of a silicon carbide MOSFET device according to Embodiment One of the disclosure.

FIG. 2 is a schematic diagram of a cell structure of a silicon carbide MOSFET device, in which a split-gate Schottky barrier diode (hereinafter referred to as SBD for short) is embedded. As shown in FIG. 2, the cell structure includes: a first conductivity type substrate 2, a first conductivity type drift region 3, a Schottky metal 4, a polycrystalline silicon gate 5, a gate insulating layer 6, a second conductivity type well region 7, a first conductivity type source region 8, a second conductivity type enhancement region 9, a source metal 10, and a drain metal 11.

Figure 3:
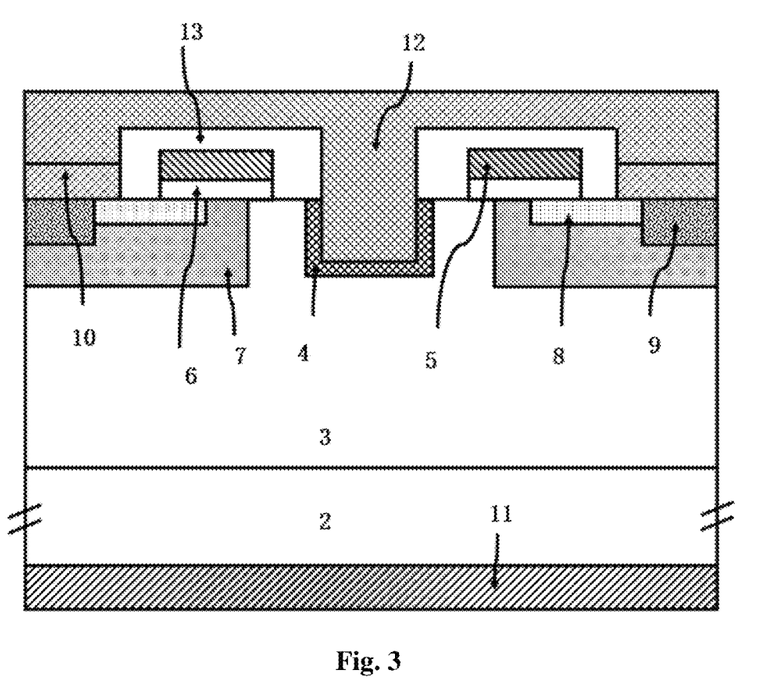
FIG. 3 is a schematic diagram of the cell structure of the silicon carbide MOSFET device, in which a Schottky metal is interconnected with a source metal and isolated from a polycrystalline silicon gate, according to Embodiment One of the disclosure.

FIG. 3 is a schematic diagram, in which the Schottky metal is interconnected with the source metal and isolated from a polycrystalline silicon gate. As shown in FIG. 3, the cell structure includes: the first conductivity type substrate 2, the first conductivity type drift region 3, the Schottky metal 4, the polycrystalline silicon gate 5, the gate insulating layer 6, the second conductivity type well region 7, the first conductivity type source region 8, the second conductivity type enhancement region 9, the source metal 10, the drain metal 11, a source compacted block metal 12, and an interlayer dielectric 13.

In the disclosure, the first conductivity type substrate 2 may include various semiconductor elements, such as silicon or silicon germanium in a monocrystalline, polycrystalline or amorphous structure, and may also include a mixed semiconductor structure, such as a silicon carbide semiconductor, a gallium nitride semiconductor, an indium phosphide semiconductor, a gallium arsenide semiconductor, an alloy semiconductor or combinations thereof, which is not limited herein. In an embodiment, the first conductivity type substrate 2 may be a silicon carbide substrate, and an N-type silicon carbide substrate or a P-type silicon carbide substrate may be used. In an embodiment, the N-type substrate is used as an example for description. In an embodiment, a first conductivity type is N type, and a second conductivity type is P type.

An embodiment provides a cell structure of the silicon carbide MOSFET device, including:
a first conductivity type drift region 3, which is located above a layer of a first conductivity type substrate 2;
a main trench, which is provided downwardly in a surface of the first conductivity type drift region 3, a Schottky metal 4 being provided on surfaces of a bottom and sidewalls of the main trench;
a second conductivity type well region 7, which is located in the surface of the first conductivity type drift region 3 and provided around the main trench;
a first conductivity type source region 8, which is located in a surface of the second conductivity type well region 7, the first conductivity type source region 8 being located at a side, close to the main trench, of the second conductivity type well region 7 but being not in contact with the main trench;
a gate structure, which is located at sides, close to the main trench, of the first conductivity type source region 8, the second conductivity type well region 7, and the first conductivity type drift region 3, the gate structure including a polycrystalline silicon gate 5 and a gate insulating layer 6 for isolating the polycrystalline silicon gate 5 from the first conductivity type source region 8, the second conductivity type well region 7, and the first conductivity type drift region 3;
a source metal 10, which is located above the first conductivity type source region 8; and a drain metal 11, which is located below the first conductivity type substrate 2,
the source metal 10 being connected to the Schottky metal 4 via a source compacted block metal 12 above the source metal 10, the polycrystalline silicon gate 5 in the gate structure being isolated from the source metal 10, the Schottky metal 4, and the source compacted block metal 12.

In an embodiment, the second conductivity type well region 7 is provided to be separated from the main trench, and the side, close to the main trench, of the second conductivity type well region 7 is not completely covered by the first conductivity type source region 8;
the gate structure includes a polycrystalline silicon planar gate structure; and
the gate insulating layer 6 of the planar gate structure is located on surfaces of the first conductivity type source region 8, the second conductivity type well region 7 and the first conductivity type drift region 3, and is in contact with the surfaces of the first conductivity type source region 8, the second conductivity type well region 7, and the first conductivity type drift region 3 at the same time; and the polycrystalline silicon gate 5 of the planar gate structure is provided above the gate insulating layer 6.

In an embodiment, the polycrystalline silicon gate 5 and the gate insulating layer 6 are isolated from the source metal 10, the Schottky metal 4, and the source compacted block metal 10 by the interlayer dielectric 13.

In an embodiment, in addition to the first conductivity type source region 8, the second conductivity type well region 7 further includes a second conductivity type enhancement region 9 therein, the second conductivity type enhancement region 9 being located at a side, distant from the main trench, of the second conductivity type well region 7; and
the source metal 10 is located on both the first conductivity type source region 8 and the second conductivity type enhancement region 9.

In an embodiment, the MOSFET device of the disclosure includes the first conductivity type substrate 2 having a relatively high concentration, and the concentration is greater than $1\times10^{18}$ cm$^{-3}$. The first conductivity type substrate 2 is provided thereon with the first conductivity type drift region 3 having a concentration in a range of $1\times10^{14}$ to $5\times10^{16}$ cm$^{-3}$, and a specific concentration can be optimized and set according to pressure resistance requirements of the cell structure. The second conductivity type well region 7, the second conductivity type enhancement region 9, and the first conductivity type source region 8 having a high concentration are sequentially provided above the first conductivity type drift region 3. The second conductivity type well region 7 has a concentration in a range of $1\times10^{16}$ to $5\times10^{18}$ cm$^{-3}$, the first conductivity type source region 8 having a concentration being greater than or equal to $1\times10^{19}$ cm$^{-3}$, the second conductivity type enhancement region 9 having a concentration being greater than $5\times10^{18}$ cm$^{-3}$.

In an embodiment, the gate insulating layer 6 is in direct contact with the first conductivity type source region 8, the second conductivity type well region 7 and the first conductivity type drift region 3 at the same time. The source metal 10 is in direct contact with the first conductivity type source region 8 and the second conductivity type enhancement region 9.

In an embodiment, the gate insulating layer 6 and the polycrystalline silicon gate 5, each of which is split into two parts, are provided from bottom to top above the first conductivity type drift region 3, and are provided in symmetric distribution at both sides of the Schottky metal 4. The polycrystalline silicon gate 5 is deposited to be the N type through the in-situ doping method and has a concentration being greater than or equal to $1\times10^{18}$ cm$^{-3}$, and the gate insulating layer 6 has a thickness being ≥40 nm. In an embodiment, since the MOSFET device further has a split-gate structure, gate parasitic capacitance of the MOSFET device can be reduced, and switching loss of the device can be further reduced.

The source metal 10 and the Schottky metal 4 respectively form ohmic contact and Schottky contact with a semiconductor material. A source metal ohmic contact material is provided to be a metal or alloy having low contact electrical resistivity, and is aluminum in an embodiment. A metal or alloy may be selected as a Schottky metal contact material, and the Schottky metal contact material may be titanium and nickel in an embodiment. The source metal 10 and the Schottky metal 4 are connected by a secondary metal source compacted block metal 12 on a surface, and the source compacted block metal 12, the Schottky metal 4, and the source metal 10 are isolated from the polycrystalline silicon gate 5 by the interlayer dielectric 13. The interlayer dielectric 13 is an oxide or nitride, and a structure is as shown in FIG. 3.

In an embodiment, the SBD integrated in the MOSFET device is provided in a JFET area. Since the MOSFET device and the SBD share a terminal area and the JFET area, the utilization area of an active area of the cell structure is increased, the use efficiency of the active area of the cell structure being improved, the overall power density of the MOSFET device being further increased.

In an embodiment, the drain metal 11 is further provided below the first conductivity type substrate. The drain metal 11 is formed of a material which is a metal or alloy having low contact electrical resistivity, and the material is aluminum in an embodiment.

In an embodiment, the main trench is provided to have a symmetric geometrical shape. In an embodiment, the specific shape may be provided to be a rectangle, an isosceles trapezoid, an isosceles triangle, a semicircle, and a semiellipse. The Schottky metal 4 is also provided to have a shape corresponding to a structure of the main trench.

In an embodiment, the drain metal 11, the first conductivity type substrate 2, the first conductivity type drift region 3, the second conductivity type well region 7, and the Schottky metal 4 constitute the SBD provided inside a cell of the MOSFET device, and may be used as a free-wheel diode when the MOSFET device is reverse-biased, so that additionally packaging the SBD is not needed when a module of the MOSFET device is packaged, which reduces the packaging cost of the device and meanwhile reduces the stray inductance generated by the module. In addition, since the SBD is integrated in the cell structure of the MOSFET device, turn-on of a PIN diode in the body of the MOSFET device can be effectively suppressed, thereby improving the bipolar injection effect and improving the long-term use reliability of the MOSFET device.

Moreover, in an embodiment, the SBD is integrated in the main trench of the JFET area, and the design of the main trench can simultaneously achieve a better compromise between an on-state current and a blocking voltage of the MOSFET device and of the SBD.

The above description is an introduction of a specific structure of a cell in the cell structure of the split-gate silicon carbide MOSFET device integrated with the SBD.

In an embodiment, a silicon carbide MOSFET device is further provided, which includes several cell structures of the silicon carbide MOSFET device according to any one of the above contents.

In an embodiment, the device may have a cell shape such as a strip, a circle, a quadrangle, or a hexagon, as well as any combination of various shapes.

Figure 6:
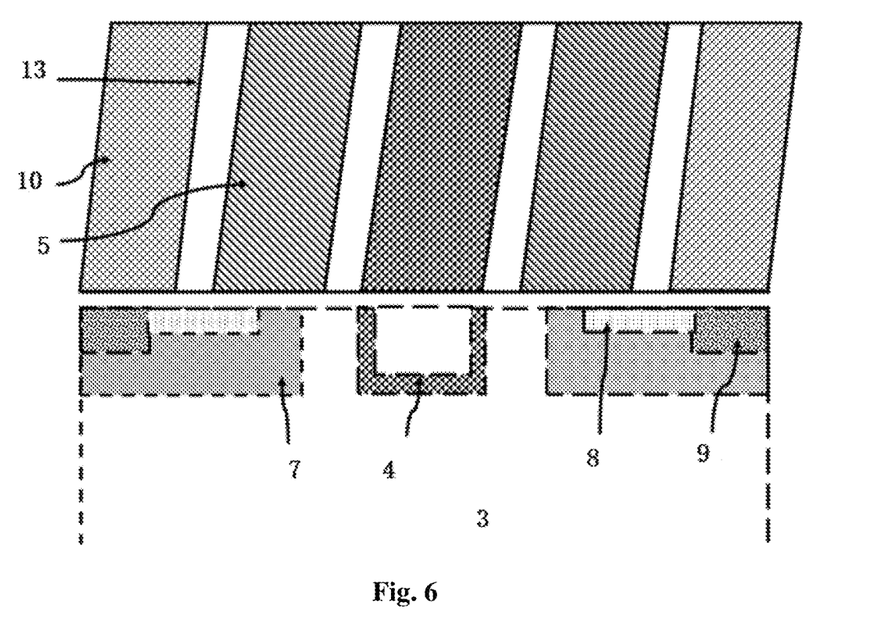
FIG. 6 is a schematic diagram of a silicon carbide MOSFET device, in which cell structures are distributed in a strip shape, according to Embodiment One to Embodiment Three of the disclosure.

In an embodiment, a cell shape of an overall cell structure of the split-gate silicon carbide MOSFET device integrated with the SBD may be provided to be a strip, which is convenient for mass production using a suitable process, as shown in FIG. 6.

Figure 7:
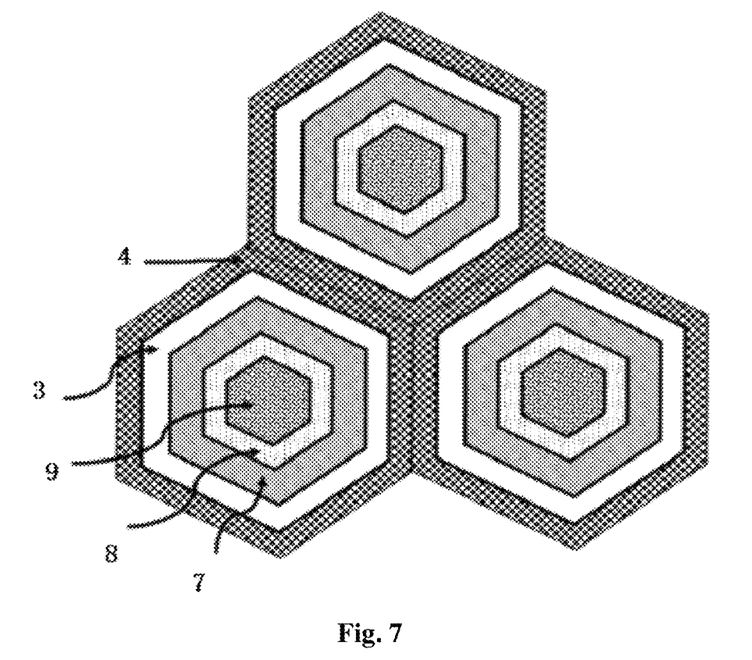
FIG. 7 is a schematic diagram of a silicon carbide MOSFET device, in which cell structures are distributed in a hexagon shape, according to Embodiment One to Embodiment Three of the disclosure.

In an embodiment, the cell shape of the overall cell structure of the split-gate silicon carbide MOSFET device integrated with the SBD may be provided to be a polygon, and in an embodiment, the cell shape may be provided to be a hexagon, a pentagon, or a quadrilateral, which facilitates mass production using different processes, as shown in FIG. 7.

To sum up, the following advantages can be seen.

1. According to the disclosure, the SBD is integrated in the cell of the silicon carbide MOSFET device, and the Schottky metal and the source metal are effectively connected using the source compacted block metal, so that additionally packaging the SBD is not needed when a module is packaged, which reduces the packaging cost and reduces the stray inductance generated by the module. The integrated SBD can further effectively suppress turn-on of a PIN diode in the body of the MOSFET device, thereby improving the bipolar injection effect and improving the long-term use reliability of the MOSFET device.

In addition, the SBD and the MOSFET device share the JFET area and the terminal area of the cell structure, which further increases the utilization area of the active area of the cell structure, thereby improving the use efficiency of the active area of the cell structure, further increases the overall power density of the MOSFET device, and improves the electrical performance of the MOSFET device.

2. According to the disclosure, the Schottky metal is provided in the main trench of the surface of the cell structure in the cell of the MOSFET device, so that a better compromise between the on-state current and the blocking voltage of the MOSFET device and of the SBD can be achieved simultaneously. Moreover, a split-gate structure of the polycrystalline silicon gate is realized, which reduces input capacitance of the MOSFET device and further reduces switching loss of the MOSFET device. Besides, the second conductivity type enhancement region is provided above the second conductivity type well region on both sides of the cell structure of the MOSFET device, which improves the ohmic contact of the source metal and meanwhile avoids triggering a parasitic bipolar transistor (BJT).

Embodiment Two

Figure 4:
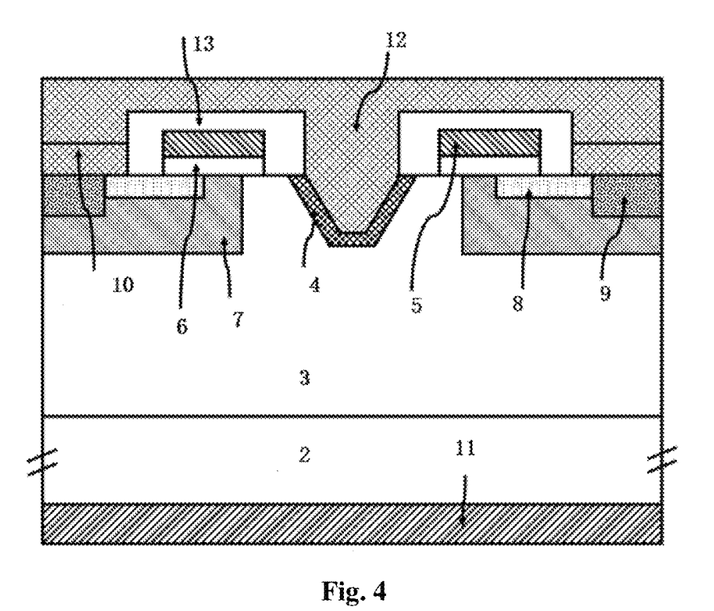
FIG. 4 is a schematic diagram of a cell structure of a silicon carbide MOSFET device, in which an inverted trapezoid shape trench structure is provided, according to Embodiment Two of the disclosure.

FIG. 4 is a schematic diagram of a cell structure of a silicon carbide MOSFET device, in which an inverted trapezoid shape trench structure is provided. Embodiment Two differs from Embodiment One in the following aspects.

The shape of the main trench at which the Schottky metal is located may be further provided to be an isosceles trapezoid, an isosceles triangle, a semicircle, a semiellipse, or other symmetric geometrical shapes, in addition to a rectangle.

Besides, according to the disclosure, a second conductivity type shielding layer 14 is provided at a local area where the Schottky metal is in contact with the drift region, which reduces the leakage current when a Schottky junction is reverse-biased and improves the electrical performance of the device.

Figure 41:
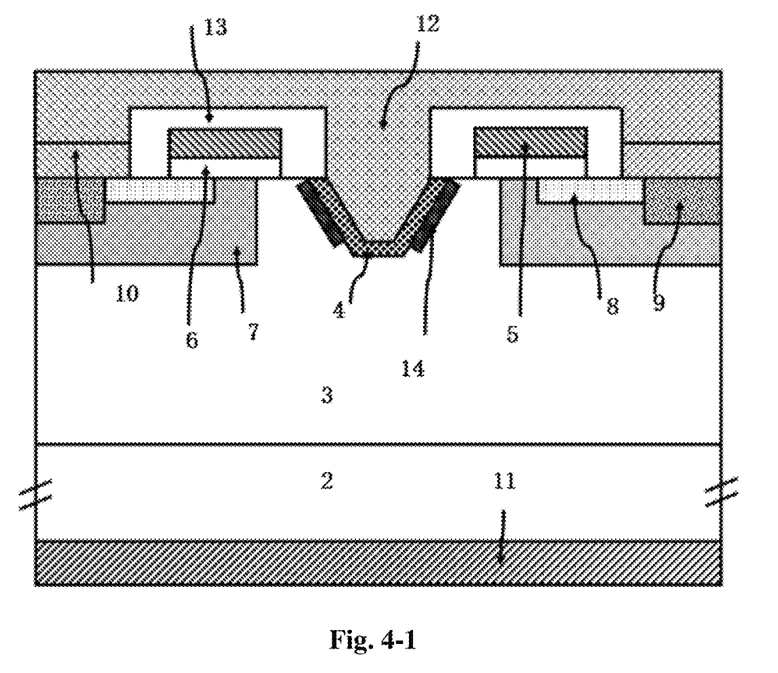

In an embodiment, in the cell structure of the silicon carbide MOSFET device, a P-type shielding layer is provided at an area where a sidewall of the main trench is in contact with the first conductivity type drift region, as shown in FIG. 4-1.

Figure 42:
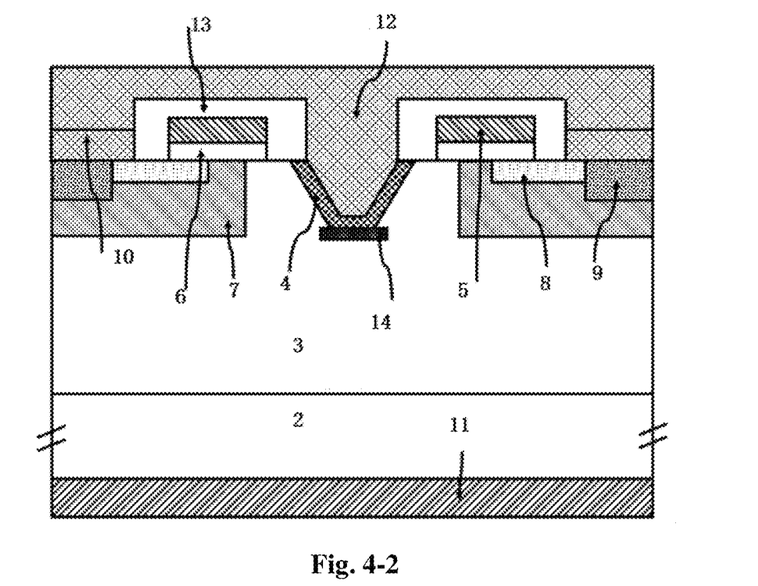

In an embodiment, in the cell structure of the silicon carbide MOSFET device, a P-type shielding layer is provided at an area where a bottom of the main trench is in contact with the first conductivity type drift region, as shown in FIG. 4-2.

Embodiment Three

Figure 5:
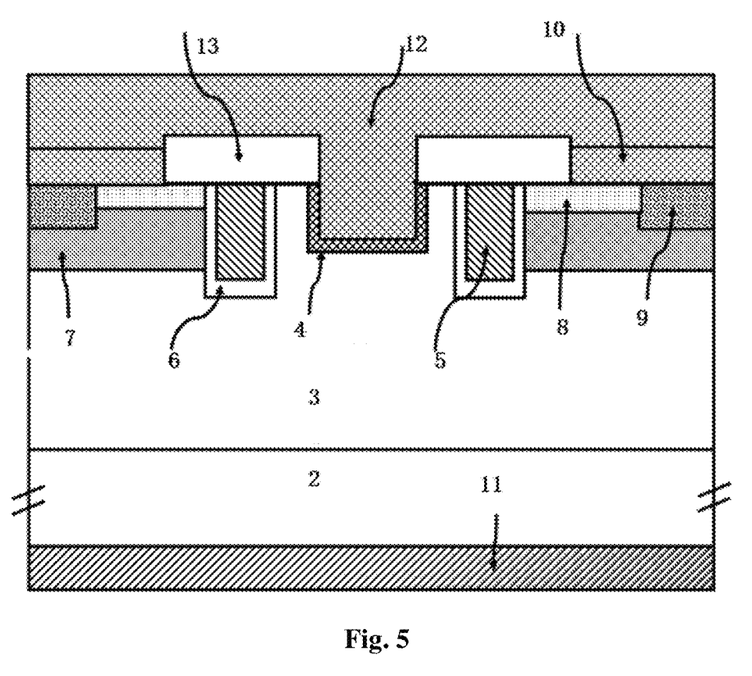
FIG. 5 is a schematic diagram of a cell structure of a trench-type silicon carbide MOSFET device according to Embodiment Three of the disclosure.

FIG. 5 is a schematic diagram of a trench-type silicon carbide MOSFET device integrated with an SBD. As shown in FIG. 5, the MOSFET device includes a first conductivity type substrate 2, a first conductivity type drift region 3, a Schottky metal 4, a polycrystalline silicon gate 5, a gate insulating layer 6, a second conductivity type well region 7, a first conductivity type source region 8, a second conductivity type enhancement region 9, a source metal 10, a drain metal 11, a source compacted block metal 12, and an interlayer dielectric 13.

In the disclosure, the first conductivity type substrate 2 may include various semiconductor elements, such as silicon or silicon germanium in a monocrystalline, polycrystalline or amorphous structure, and may also include a mixed semiconductor structure, such as a silicon carbide semiconductor, a gallium nitride semiconductor, an indium phosphide semiconductor, a gallium arsenide semiconductor, an alloy semiconductor or combinations thereof, which is not limited herein. In an embodiment, the first conductivity type substrate 2 may be a silicon carbide substrate, and an N-type silicon carbide substrate or a P-type silicon carbide substrate may be used. In an embodiment, the N-type substrate is used as an example for description.

In an embodiment, a first conductivity type is N type, and a second conductivity type is P type.

An embodiment provides a cell structure of the silicon carbide MOSFET device, including:
a first conductivity type drift region 3, which is located above a layer of a first conductivity type substrate 2;
a main trench, which is provided downwardly in a surface of the first conductivity type drift region 3, a Schottky metal 4 being provided on surfaces of a bottom and sidewalls of the main trench;
a second conductivity type well region 7, which is located in the surface of the first conductivity type drift region 3 and provided around the main trench;
a first conductivity type source region 8, which is located in a surface of the second conductivity type well region 7, the source region being located at a side, close to the main trench, of the second conductivity type well region 7 but being not in contact with the main trench;
a gate structure, which is located at sides, close to the main trench, of the first conductivity type source region 8, the second conductivity type well region 7, and the first conductivity type drift region 3, the gate structure including a polycrystalline silicon gate 5 and a gate insulating layer 6 for isolating the polycrystalline silicon gate 5 from the first conductivity type source region 8, the second conductivity type well region 7, and the first conductivity type drift region 3;
a source metal 10, which is located above the first conductivity type source region 8; and a drain metal 11, which is located below the first conductivity type substrate 2,
the source metal 10 being connected to the Schottky metal 4 via a source compacted block metal 12 above the source metal 10, the polycrystalline silicon gate 5 in the gate structure being isolated from the source metal 10, the Schottky metal 4, and the source compacted block metal 12.

In an embodiment, in addition to the first conductivity type source region 8, the second conductivity type well region 7 further includes a second conductivity type enhancement region 9, the second conductivity type enhancement region 9 being located at a side, distant from the main trench, of the second conductivity type well region 7; and the source metal 10 is located on both the first conductivity type source region 8 and the second conductivity type enhancement region 9.

In an embodiment, a cross section of the trench at which the Schottky metal 4 is located has a shape of a rectangle, an isosceles trapezoid, a semicircle, a semiellipse, or other shapes with a symmetric structure.

In an embodiment, the MOSFET device of the disclosure includes the first conductivity type substrate 2 having a relatively high concentration, and the concentration is greater than $1\times10^{18}$ cm$^{-3}$. The first conductivity type substrate 2 is provided thereon with the first conductivity type drift region 3 having a concentration in a range of $1\times10^{14}$ to $5\times10^{16}$ cm$^{-3}$, and a specific concentration can be optimized and set according to pressure resistance requirements of the cell structure. The second conductivity type well region 7, the second conductivity type enhancement region 9, and the first conductivity type source region 8 having a high concentration are sequentially provided above the first conductivity type drift region 3. The second conductivity type well region 7 has a concentration in a range of $1\times10^{16}$ to $5\times10^{18}$ cm$^{-3}$, the first conductivity type source region 8 having a concentration being greater than or equal to $1\times10^{19}$ cm$^{-3}$, the second conductivity type enhancement region 9 having a concentration being greater than $5\times10^{18}$ cm$^{-3}$.

In an embodiment, the second conductivity type well region 7 is provided to be separated from the main trench, and the side, close to the main trench, of the well region is completely covered by the source region, as shown in FIG. 5.

The gate structure includes a polycrystalline silicon trench gate structure;

a gate trench is provided downwardly in a surface of the first conductivity type drift region 3 between the second conductivity type well region 7 and the main trench, a wall, at a side distant from the main trench, of the gate trench being in contact with the first conductivity type source region 8, the second conductivity type well region 7, and the first conductivity type drift region 3 at the same time; and the gate insulating layer 6 of the trench gate structure is provided on a bottom and walls of the gate trench, and is used to isolate the polycrystalline silicon gate 5 of the trench gate structure provided in the gate trench from the first conductivity type source region 8, the second conductivity type well region 7, and the first conductivity type drift region 3.

In an embodiment, the polycrystalline silicon gate 5 is provided in the trench, and specific details are as follows:

the gate insulating layer 6 is provided at left and right sides and a bottom of the polycrystalline silicon gate 5 to isolate the polycrystalline silicon gate 5 from the first conductivity type source region 8, the second conductivity type well region 7, and the first conductivity type drift region 3, and the interlayer dielectric 13 is provided on the polycrystalline silicon gate 5 to isolate the polycrystalline silicon gate 5 from the source compacted block metal 12; and the gate insulating layer 6 is in contact with the first conductivity type source region 8, the second conductivity type well region 7, and the first conductivity type drift region 3, and the source metal 10 is in direct contact with the first conductivity type source region 8 and the second conductivity type enhancement region 9.

Besides, according to the disclosure, the second conductivity type well region is provided at a local area where the Schottky metal 4 is in contact with the first conductivity type drift region 3, which reduces the leakage current when a Schottky junction is reverse-biased and improves the electrical performance of the device.

Figure 51:
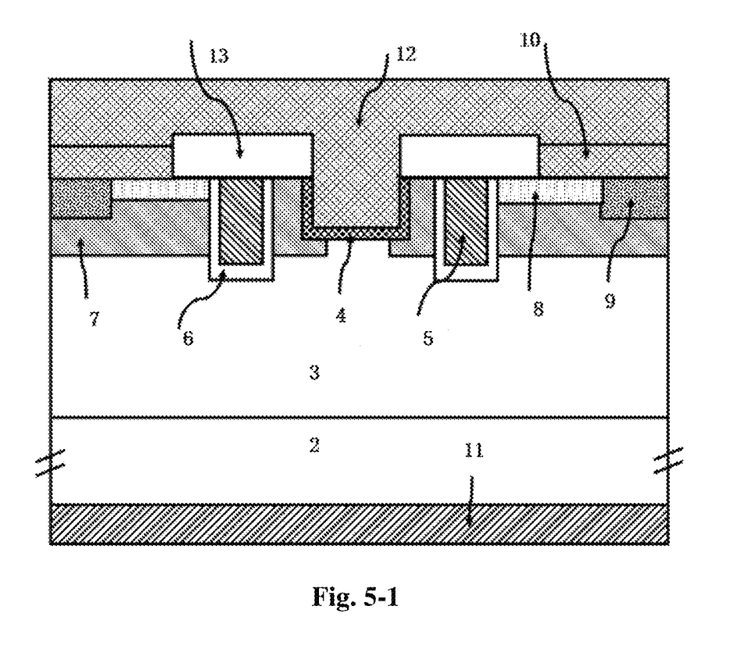

Special details are as follows. The second conductivity type well region 7 is provided to be in contact with the main trench, and the side, close to the main trench, of the second conductivity type well region 7 is not completely covered by the first conductivity type source region 8, as shown in FIG. 5-1.

The gate structure includes a polycrystalline silicon trench gate structure;

a gate trench separated from the main trench is provided downwardly in the surface of the second conductivity type well region 7 at an area which is at the side, close to the main trench, of the second conductivity type well region 7 and is not completely covered by the first conductivity type source region 8, the gate trench having a depth greater than a depth of the second conductivity type well region 7, and a wall, at a side distant from the main trench, of the gate trench being in contact with the first conductivity type source region 8, the second conductivity type well region 7, and the first conductivity type drift region 3 at the same time; and the gate insulating layer 6 of the trench gate structure is provided on a bottom and walls of the gate trench, and is used to isolate the polycrystalline silicon gate 5 of the trench gate structure provided in the gate trench from the first conductivity type source region 8, the second conductivity type well region 7, and the first conductivity type drift region 3.

In an embodiment, the gate insulating layer 6 and the polycrystalline silicon gate 5, each of which is split into two parts, are provided in symmetric distribution at both sides of the Schottky metal 4. The polycrystalline silicon gate 5 is the N type and has a concentration being $\geq 1 \times 10^{18}$ cm$^{-3}$, and the gate insulating layer 6 has a thickness being $\geq 40$ nm. In an embodiment, since the MOSFET device further has a split-gate structure, input capacitance of the MOSFET device can be reduced, and switching loss of the device can be further reduced.

The source metal 10 and the Schottky metal 4 respectively form ohmic contact and Schottky contact with a semiconductor material. A source metal ohmic contact material is provided to be a metal or alloy having low contact electrical resistivity, and is aluminum in an embodiment. A metal or alloy may be selected as a Schottky metal contact material, and the Schottky metal contact material may be titanium and nickel in an embodiment. The source metal 10 and the Schottky metal 4 are connected by a secondary metal source compacted block metal 12 on a surface, and the source compacted block metal 12, the Schottky metal 4, and the source metal 10 are isolated from the polycrystalline silicon gate 5 and the first conductivity type source region 8 by the interlayer dielectric 13. The interlayer dielectric 13 is an oxide or nitride, and a structure is shown in FIG. 5 or FIG. 5-1.

In an embodiment, the SBD integrated in the MOSFET device is provided in a JFET area. Since the MOSFET device and the SBD share a terminal area and the JFET area, the use efficiency of the active area of the cell structure is improved, and the overall power density of the MOSFET device is further increased.

In an embodiment, the drain metal 11 is further provided below the first conductivity type substrate 2. The drain metal 11 is formed of a material which is a metal or alloy having low contact electrical resistivity, and the material is aluminum in an embodiment.

In an embodiment, the main trench is provided to have a symmetric geometrical shape. In an embodiment, the specific shape may be provided to be a rectangle, an isosceles trapezoid, an isosceles triangle, a semicircle, and a semiellipse. The Schottky metal 4 is also provided to have a shape corresponding to a structure of the main trench.

In an embodiment, the drain metal 11, the first conductivity type substrate 2, the first conductivity type drift region 3, the second conductivity type well region 7, and the Schottky metal 4 constitute the SBD provided inside a cell of the MOSFET device, and may be used as a free-wheel diode when the MOSFET device is reverse-biased, so that additionally packaging the SBD is not needed when a module of the MOSFET device is packaged and that an additional bonding procedure is not needed, which reduces the packaging cost of the device and meanwhile reduces the stray inductance. In addition, since the SBD is integrated in the cell structure of the MOSFET device, turn-on of a PIN diode in the body of the MOSFET device can be effectively suppressed, thereby improving the bipolar injection effect and improving the long-term use reliability of the MOSFET device.

In an embodiment, the SBD integrated in the MOSFET device is located in the JFET area, which improves the use efficiency of the active area of the cell structure and further increases the overall power density of the MOSFET device.

Moreover, in an embodiment, the SBD is integrated in the main trench of the JFET area, and the design of the main trench can simultaneously achieve a better compromise between an on-state current and a blocking voltage of the MOSFET device and of the SBD.

In an embodiment, a cell shape of an overall cell structure of the split-gate silicon carbide MOSFET device integrated with the SBD may be provided to be a strip, which is convenient for mass production using a suitable process, as shown in FIG. 6.

In an embodiment, the cell shape of the overall cell structure of the split-gate silicon carbide MOSFET device integrated with the SBD may be provided to be a polygon, and in an embodiment, the cell shape may be provided to be a hexagon, a pentagon, or a quadrilateral, which facilitates mass production using different processes, as shown in FIG. 7.

To sum up, the following advantages can be seen.

1. According to the disclosure, the SBD is integrated in the cell of the silicon carbide MOSFET device, and the Schottky metal and the source metal are effectively connected using the source compacted block metal, so that additionally packaging the SBD is not needed when a module is packaged, which reduces the packaging cost and reduces the stray inductance. The integrated SBD can further effectively suppress turn-on of a PIN diode in the body of the MOSFET device, thereby improving the bipolar injection effect and improving the long-term use reliability of the MOSFET device.

In addition, the SBD and the MOSFET device share the JFET area and the terminal area of the cell structure, which further increases the utilization area of the active area of the cell structure, thereby improving the use efficiency of the active area of the cell structure, further increases the overall power density of the MOSFET device, and improves the electrical performance of the MOSFET device.

2. According to the disclosure, the Schottky metal is provided in the trench of the surface of the cell structure of the MOSFET device, so that a better compromise between the on-state current and the blocking voltage of the MOSFET device and of the SBD can be achieved simultaneously. Moreover, a split-gate structure of the polycrystalline silicon gate is realized, which reduces input capacitance of the MOSFET device and further reduces switching loss of the MOSFET device. Besides, the second conductivity type enhancement region is provided above the second conductivity type well region on both sides of the cell structure, which improves the ohmic contact of the source metal and meanwhile avoids triggering a parasitic bipolar transistor (BJT). Besides, according to the disclosure, the second conductivity type well region is provided at a local area where the Schottky metal is in contact with the first conductivity type drift region, which reduces the leakage current when a Schottky junction is reverse-biased and improves the electrical performance of the device.

In addition, in other embodiments, the disclosure is also applicable to a MOSFET device with a second conductivity type channel.

Compared with some circumstances, one or more embodiments of the disclosure have the following advantages.

1. According to the disclosure, the SBD is integrated in the cell structure of the silicon carbide MOSFET device, and the Schottky metal and the source metal are effectively connected using the source compacted block metal, so that additionally packaging the SBD is not needed when a module is packaged, which reduces the packaging cost and reduces the stray inductance. The integrated SBD further effectively suppresses turn-on of a PIN diode in the body of the MOSFET device, thereby improving the bipolar injection effect and improving the long-term use reliability of the MOSFET device.

In addition, since the integrated SBD is provided in the JFET area, the SBD and the MOSFET device share the JFET area and the terminal area of the cell structure, which further increases the utilization area of the active area of the cell structure, thereby improving the use efficiency of the active area of the cell structure, further increases the overall power density of the MOSFET device, and improves the electrical performance of the MOSFET device.

2. According to the disclosure, the Schottky metal is provided in the trench of the surface of the cell structure of the MOSFET device, so that a better compromise between the on-state current and the blocking voltage of the MOSFET device and of the SBD can be achieved simultaneously. Moreover, a split-gate structure of the polycrystalline silicon gate is realized, which reduces parasitic capacitance of the gate structure of the MOSFET device and further reduces switching loss of the MOSFET device. Besides, the second conductivity type enhancement region is provided above the second conductivity type well region on both sides of the cell structure, which improves the ohmic contact of the source metal and meanwhile avoids triggering a parasitic bipolar transistor (BJT). Besides, according to the disclosure, the second conductivity type shielding layer is provided, which reduces the leakage current when a Schottky junction is reverse-biased and improves the electrical performance of the device.

According to the disclosure, the SBD is integrated in the cell of the silicon carbide MOSFET device, which effectively suppresses turn-on of a PIN diode in the body of the MOSFET device, thereby improving the bipolar injection effect and improving the long-term use reliability of the MOSFET device. Meanwhile, the Schottky metal and the source metal are effectively provided, so that additionally packaging the SBD is not needed when a module is packaged, which reduces the packaging cost and reduces the stray inductance.

It should be further noted that, directional words mentioned in the embodiments, such as "above", "below", "front", "back", "left", "right" and the like are only directions in the drawings, and are not used to limit the protection scope of the disclosure. In a case where confusions may be caused in understanding of the disclosure, common structures or configurations will be omitted. Moreover, shapes and sizes of components in the drawings do not reflect actual sizes or proportions, and are only used to illustrate contents in embodiments of the disclosure. Further, in claims, any reference numeral in parentheses should not be construed as a limitation on the claims. Unless there is a known contrary meaning, numerical parameters in the disclosure and the attached claims are approximate values and can be changed according to desired properties obtained in the contents of the disclosure. Specifically, numbers used in the description and claims and indicating the content and reaction conditions and the like should all be understood as being limited by the word "about". Generally, the word "about" means to include changes of ±10% in some embodiments, changes of ±5% in some embodiments, changes of ±1% in some embodiments, or changes of ±0.5% in some embodiments of a certain number. Besides, the word "include" does not exclude a case that elements or steps not listed in the claims are present. Using of the word "a" or "one" preceding an element does not exclude a case that multiple such elements are present.

Although embodiments of the disclosure are described above, those embodiments are merely described for better understanding of the disclosure, rather than for limiting the disclosure. Any skilled person in the field of the disclosure can make any amendment or change in implementation forms and details without departing from the spirit and scope of the disclosure. The protection scope of the disclosure is not limited to specific embodiments disclosed, but includes all solutions falling into the scope of the claims.

The invention claimed is:

1. A cell structure of a silicon carbide MOSFET device, comprising:
   a first conductivity type drift region, which is located above a first conductivity type substrate;
   a main trench, which is provided downwardly in a surface of the drift region, a Schottky metal being provided on surfaces of a bottom and sidewalls of the main trench;
   a second conductivity type well region, which is located in the surface of the drift region and provided around the main trench;
   a first conductivity type source region, which is located in a surface of the well region, wherein the source region is located at a side, close to the main trench, of the well region, but is not in contact with the main trench;
   a gate structure, which is located at sides, close to the main trench, of the source region, the well region, and the drift region, wherein the gate structure comprises a gate and a gate insulating layer for isolating the gate from the source region, the well region, and the drift region;
   a source metal, which is located above the source region; and
   a drain metal, which is located below the substrate,
   wherein, the source metal is connected to the Schottky metal via a source compacted block metal above the source metal, and at least the gate in the gate structure is isolated from the source metal, the Schottky metal, and the source compacted block metal,
   the well region is provided to be in contact with the main trench, and the side, close to the main trench, of the well region is not completely covered by the source region;
   the gate structure comprises a polycrystalline silicon trench gate structure;
   a gate trench separated from the main trench is provided downwardly in the surface of the well region at an area which is at the side, close to the main trench, of the well region and is not completely covered by the source region, wherein the gate trench has a depth greater than a depth of the well region, and a wall, at a side distant from the main trench, of the gate trench is in contact with the source region, the well region, and the drift region at the same time; and
   the gate insulating layer of the trench gate structure is provided on a bottom and walls of the gate trench, and is used to isolate the gate of the trench gate structure provided in the gate trench from the source region, the well region, and the drift region.

2. The cell structure of the silicon carbide MOSFET device according to claim 1, wherein
   the well region is provided to be separated from the main trench, and the side, close to the main trench, of the well region is not completely covered by the source region;
   the gate structure comprises a polycrystalline silicon planar gate structure; and
   the gate insulating layer of the planar gate structure is located on surfaces of the source region, the well region and the drift region, and is in contact with the surfaces of the source region, the well region and the drift region at the same time; and the gate of the planar gate structure is provided above the gate insulating layer.

3. The cell structure of the silicon carbide MOSFET device according to claim 2, wherein the cell structure further comprises:
   a second conductivity type shielding layer, which is provided at a local area where the Schottky metal is in contact with the drift region.

4. The cell structure of the silicon carbide MOSFET device according to claim 1, wherein
   the gate and the gate insulating layer are isolated from the source metal, the Schottky metal, and the source compacted block metal by the interlayer dielectric.

5. The cell structure of the silicon carbide MOSFET device according to claim 4, wherein
   in addition to the source region, the well region further comprises a second conductivity type enhancement region therein, wherein the enhancement region is located at a side, distant from the main trench, of the well region; and
   the source metal is located on both the source region and the enhancement region.

6. The cell structure of the silicon carbide MOSFET device according to claim 5, wherein
   the source region has a concentration being greater than or equal to $1\times10^{19}$ cm$^{-3}$;
   the enhancement region has a concentration being greater than $5\times10^{18}$ cm$^{-3}$;
   the well region has a concentration in a range of $1\times10^{16}$ to $5\times10^{18}$ cm$^{-3}$;
   the drift region has a concentration in a range of $1\times10^{14}$ to $5\times10^{16}$ cm$^{-3}$;
   the gate has a concentration being greater than or equal to $1\times10^{18}$ cm$^{-3}$; and
   the gate insulating layer has a thickness being ≥40 nm.

7. The cell structure of the silicon carbide MOSFET device according to claim 1, wherein
   a cross section of the main trench at which the Schottky metal is located has a shape of a rectangle, an isosceles trapezoid, a semicircle, a semiellipse, or other shapes with a symmetric structure.

8. A silicon carbide MOSFET device, wherein the MOSFET device comprises several cell structures of the silicon carbide MOSFET device according to claim 1.

9. The silicon carbide MOSFET device according to claim 8, wherein
   the device has a cell shape such as a strip, a circle, a quadrangle, or a hexagon, as well as any combination of various shapes.

* * * * *